(12) United States Patent
Kim et al.

(10) Patent No.: US 11,475,835 B2
(45) Date of Patent: *Oct. 18, 2022

(54) DISPLAY DEVICE

(71) Applicant: SAMSUNG DISPLAY CO., LTD., Yongin-si (KR)

(72) Inventors: Hyo Jung Kim, Yongin-si (KR); Tae Young Kim, Yongin-si (KR); Yong Sung Park, Yongin-si (KR); Jong Woo Park, Yongin-si (KR); Mi Seon Seo, Yongin-si (KR); Keun Soo Lee, Yongin-si (KR); Ki Ju Im, Yongin-si (KR); Dae Youn Cho, Yongin-si (KR); Young Tae Choi, Yongin-si (KR); Hyun Cheol Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/226,817

(22) Filed: Apr. 9, 2021

(65) Prior Publication Data

US 2021/0256906 A1 Aug. 19, 2021

Related U.S. Application Data

(62) Division of application No. 16/567,578, filed on Sep. 11, 2019, now Pat. No. 11,017,719.

(30) Foreign Application Priority Data

Jan. 24, 2019 (KR) .................. 10-2019-0009400

(51) Int. Cl.
*G09G 3/3233* (2016.01)
*H01L 27/32* (2006.01)

(52) U.S. Cl.
CPC ....... *G09G 3/3233* (2013.01); *H01L 27/3262* (2013.01); *H01L 27/3265* (2013.01);
(Continued)

(58) Field of Classification Search
None
See application file for complete search history.

(56) References Cited

U.S. PATENT DOCUMENTS 9,455,309 B2 9/2016 Choi et al.
2011/0115835 A1 5/2011 Lee
(Continued)

FOREIGN PATENT DOCUMENTS

CN 102890910 6/2015
KR 10-2016-0017719 2/2016
(Continued)

*Primary Examiner* — Duane N Taylor, Jr.
(74) *Attorney, Agent, or Firm* — F. Chau & Associates, LLC

(57) ABSTRACT

A display device includes a plurality of pixels. Each pixel includes a first transistor that controls an amount of current received from a first power supply voltage line connected via a second node to an organic light emitting diode in response to a voltage of a first node, a second transistor connected between a data line and the second node and that includes a first gate electrode connected to a first scan line, a light emitting line connected to a gate electrode of at least one light emitting transistor located in a current path between the first power supply voltage line and the organic light emitting diode, and a seventh transistor connected between one of at least one second gate electrode of the second transistor and the light emitting line. Accordingly, a threshold voltage of a switching transistor included in each of the plurality of pixels may be negatively shifted.

8 Claims, 5 Drawing Sheets

(52) U.S. Cl.
CPC . *H01L 27/3276* (2013.01); *G09G 2300/0809* (2013.01); *G09G 2310/0202* (2013.01); *G09G 2320/0257* (2013.01)

(56) References Cited

U.S. PATENT DOCUMENTS

| | | | |
|---|---|---|---|
| 2013/0025743 A1 | 10/2013 | Jin et al. | |
| 2014/0240304 A1* | 8/2014 | In | G09G 3/3233 345/212 |
| 2016/0005384 A1 | 1/2016 | Yoon et al. | |
| 2018/0166520 A1 | 6/2018 | Kang et al. | |
| 2018/0166816 A1 | 6/2018 | Chai et al. | |
| 2020/0243006 A1 | 7/2020 | Kim et al. | |

FOREIGN PATENT DOCUMENTS

| | | |
|---|---|---|
| KR | 10-2018-0065731 | 6/2018 |
| KR | 10-2018-0065736 | 6/2018 |
| KR | 10-2018-0067768 | 6/2018 |

\* cited by examiner

DISPLAY DEVICE

CROSS-REFERENCE TO RELATED APPLICATION

This application is a divisional of U.S. patent application Ser. No. 16/567,578, filed on Sep. 11, 2019 in the U.S. Patent and Trademark Office, which claims priority under 35 USC § 119 from, and the benefit of, Korean Patent Application No. 10-2019-0009400, filed in the Korean Intellectual Property Office on Jan. 24, 2019, the contents of both of which are herein incorporated reference in their entireties.

BACKGROUND

1. Technical Field

Embodiments of the present disclosure are directed to a display device.

2. Description of the Related Art

As information technology has developed, importance of a display device, which connects user and information, has become emphasized. In response to this, the use of display devices, such as a liquid crystal display device, an organic light emitting display device, or a plasma display device, has been increasing.

A display device includes a display panel for displaying an image, and the display panel includes a plurality of pixels, each of which is a minimum unit for displaying an image. A pixel circuit is formed in each of the pixels, and the pixel circuit includes transistors, such as a drive transistor and a switching transistor. A threshold voltage of the transistor included in the pixel circuit is set within a specific range, and if a threshold voltage is out of the range, an afterimage is visible on the display device or an image displayed on a part of the display device is displayed abnormally on other parts.

SUMMARY

An exemplary embodiment of the present disclosure provides a display device includes a metal layer below the active layer of a switching transistor included in each of a plurality of pixels, and a high-level voltage is transmitted to the metal layer to negatively shift a threshold voltage of the switching transistor.

Another exemplary embodiment of the present disclosure provides a display device in which a metal layer disposed under a switching transistor is electrically connected to a light emitting line, a high-level voltage light emitting signal is transmitted to the metal layer during a light emission non-permission period of an organic light emitting diode and the metal layer floats during a light emission permission period, where visibility of an abnormal horizontal stripe of the display device is reduced.

Still another exemplary embodiment of the present disclosure provides a display device in which a metal layer disposed under a switching transistor is connected to a high power supply voltage line and a high-level voltage is continuously transmitted to the metal layer during an image frame, and a negative shift of a threshold voltage of the switching transistor is more effectively performed.

According to an exemplary embodiment of the disclosure, there is provided a display device. The display device comprises a plurality of pixels. Each pixel includes a first transistor that controls an amount of current received from a first power supply voltage line connected via a second node to an organic light emitting diode in response to a voltage of a first node; a second transistor connected between a data line and the second node and that includes a first gate electrode connected to a first scan line; a light emitting line connected to a gate electrode of at least one light emitting transistor located in a current path between the first power supply voltage line and the organic light emitting diode; and a seventh transistor connected between one of at least one second gate electrode of the second transistor and the light emitting line.

According to an exemplary embodiment of the disclosure, there is provided a display device. The display device comprises a plurality of pixels. Each pixel includes a first transistor that controls an amount of current received from a first power supply voltage line connected via a second node to an organic light emitting diode in response to a voltage of a first node, a second transistor connected between a data line and the second node and that includes a first gate electrode connected to a first scan line and one of at least one second gate electrode connected to the first power supply voltage line, and a light emitting line connected to a gate electrode of at least one light emitting transistor located in a current path between the first power supply voltage line and the organic light emitting diode. The light emitting signal is transmitted to the at least one second gate electrode of the second transistor when the light emitting signal of the light emitting line is at a high level, and the at least one second gate electrode floats when the light emitting signal is at a low level.

DETAILED DESCRIPTION OF EXEMPLARY EMBODIMENTS

Figure 1:
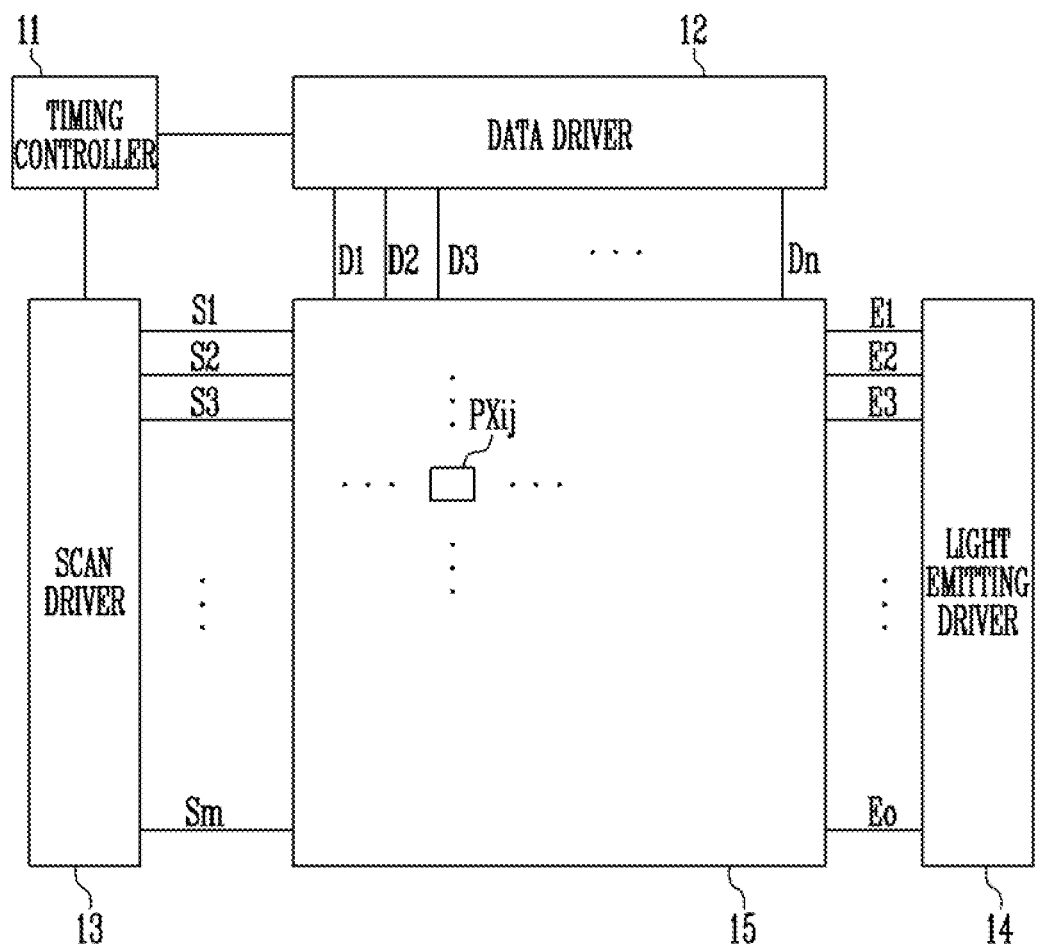
FIG. 1 is a schematic diagram of a display device according to an exemplary embodiment of the present disclosure.

Features of the present disclosure and methods of achieving the features will become apparent with reference to exemplary embodiments described in detail below with reference to the accompanying drawings. Embodiments of the present disclosure may, however, take many different forms and should not be construed as being limited to the exemplary embodiments set forth herein.

Like reference numerals may refer to like elements throughout the specification.

In interpreting the configuration element, it is construed to include an error range even if there is no separate description.

Hereinafter, exemplary embodiments of the present disclosure will be described in detail with reference to the accompanying drawings.

FIG. 1 is a schematic diagram of a display device according to an exemplary embodiment of the present disclosure.

Referring to FIG. 1, according to an embodiment, a display device 100 includes a timing controller 11, a data driver 12, a scan driver 13, a light emitting driver 14, and a pixel unit 15.

According to an embodiment, the timing controller 11 provides the data driver 12 with gray scale values, such as data, and control signals according to a specification of the data driver 12. The timing controller 11 provides the scan driver 13 with a clock signal, a scan start signal, etc., according to a specification of the scan driver 13. The timing controller 11 provides the light emitting driver 14 with the clock signal, a light emitting stop signal, etc., according to a specification of the light emitting driver 14.

According to an embodiment, the data driver 12 generates and transmits data signals to data lines D1 to Dn using the gray scale values and control signals received from the timing controller 11. For example, the data driver 12 samples the gray level values using the clock signal and transmits data voltages corresponding to the gray scale values to the data lines D1 to Dn as data signals. n is a natural number.

According to an embodiment, the scan driver 13 receives a clock signal, a scan start signal, etc., from the timing controller 11 and generates and transmits scan signals to scan lines S1 to Sm. For example, the scan driver 13 sequentially transmits scan signals that have turn-on level pulses to the scan lines S1 to Sm. For example, the scan driver 13 is a shift register and generates scan signals so that the scan start signals, each having a turn-on level pulse shape, are sequentially transmitted to a next stage circuit under the control of the clock signal. m is a natural number.

According to an embodiment, the light emitting driver 14 receives the clock signal, a light emitting stop signal, etc., from the timing controller 11 and generates and transmits light emitting signals to light emitting lines E1 to Eo. For example, the light emitting driver 14 sequentially transmits light emitting signals that have turn-off level pulses to the light emitting lines E1 to Eo. For example, the light emitting driver 14 is a shift register and generates the light emitting signals so that the light emitting stop signals, each having a turn-off level pulse shape, are sequentially transmitted to a next stage circuit under the control of the clock signal. o is a natural number.

The pixel unit 15 includes a plurality of pixels. According to an embodiment, each of the plurality of pixels is connected to a data line, a scan line, and a light emitting line. For example, the pixel unit 15 includes a pixel PXij connected to an i-th scan line Si, a j-th data line Dj, and an i-th light emitting line Ei. Here, i and j are natural numbers.

Figure 2:
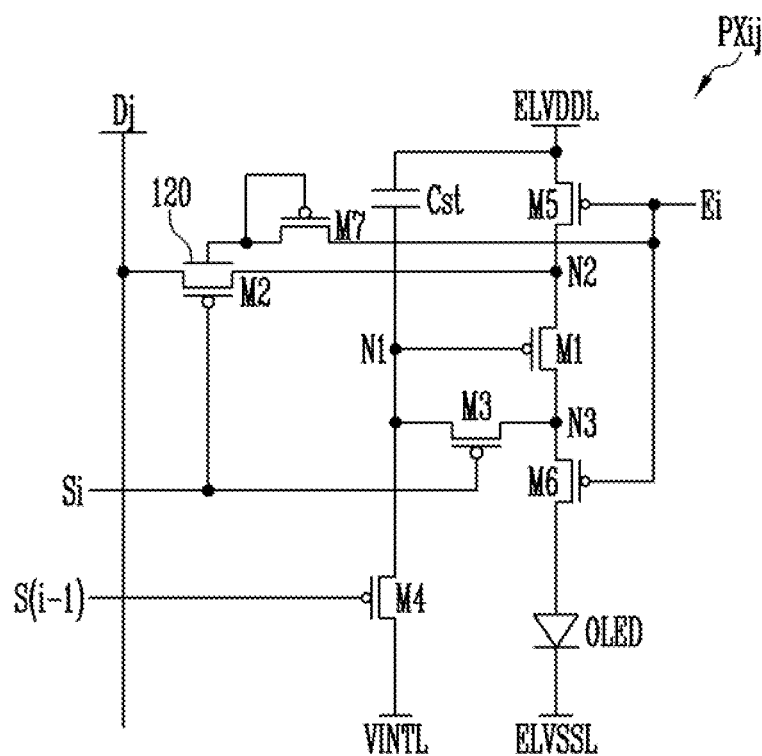
FIG. 2 is a circuit diagram of one pixel of a display device according to an exemplary embodiment of the present disclosure.

FIG. 2 is a circuit diagram of one pixel of a display device according to an exemplary embodiment of the present disclosure. FIG. 2 illustrates a circuit of the pixel PXij in FIG. 1.

Referring to FIG. 2, according to an embodiment, pixel PXij includes first to seventh transistors M1 to M7, a storage capacitor Cst, and an organic light emitting diode OLED. Here, the second transistor M2 is a double gate transistor. For example, the second transistor M2 has a first gate electrode connected to the first scan line Si, and a second gate electrode 120, or a back gate or a barrier metal layer, connected to the seventh transistor M7.

In a present exemplary embodiment, the first to seventh transistors M1 to M7 are illustrated as P type transistors. Accordingly, hereinafter, for the sake of convenient description, when a voltage applied to the gate electrode of the transistor is at a low level, the voltage level is referred to as a turn-on level, and when the voltage is at a high level, the voltage level is referred to as a turn-off level.

Those skilled in the art will be able to realize the present exemplary embodiment by replacing at least some of the first to seventh transistors M1 to M7 with an N-type transistor. A P-type transistor is turned on when a gate-source voltage is less than a threshold voltage, i.e. a negative number. An N-type transistor is turned on when the gate-source voltage exceeds a threshold voltage, i.e., a positive number.

According to an embodiment, the first transistor M1 is connected between a second node N2 and a third node N3. A gate electrode of the first transistor M1 is connected to a first node N1. The first transistor M1 can be turned on or off in response to a voltage of the first node Ni. The first transistor M1 is referred to as a drive transistor.

According to an embodiment, the second transistor M2 is connected between the data line Dj and the second node N2. A gate electrode of the second transistor M2 is connected to the first scan line Si. The second transistor M2 can be turned on or off in response to a first scan signal transmitted to the first scan line Si. The second transistor M2 is referred to as a scan transistor or a switching transistor.

According to an embodiment, a second gate electrode 120 protects an active layer of the second transistor M2 and can decrease a threshold voltage of the second transistor M2. The second gate electrode 120 is disposed in a lower portion of the second transistor M2 and overlaps the active layer of the second transistor M2. Disposition of the second gate electrode 120 and the second transistor M2 will be described in detail below with reference to FIG. 3.

According to an embodiment, the third transistor M3 is connected between the first node N1 and a third node N3. A gate electrode of the third transistor M3 is connected to the first scan line Si. The third transistor M3 can be turned on or off in response to the first scan signal transmitted to the first scan line Si.

According to an embodiment, the fourth transistor M4 is connected between the first node N1 and an initialization power supply line VINTL. A gate electrode of the fourth transistor M4 is connected to the second scan line S(i−1). The fourth transistor M4 can be turned on or off in response to the second scan signal transmitted to the second scan line S(i−1).

According to an embodiment, the fifth transistor M5 is connected between a first power supply voltage line ELVDDL and the second node N2. A gate electrode of the fifth transistor M5 is connected to a light emitting line Ei. The fifth transistor M5 can be turned on or turned off in response to a light emitting signal transmitted to the emission line Ei.

According to an embodiment, the sixth transistor M6 is connected between the third node N3 and an anode electrode of the organic light emitting diode OLED. A gate electrode of the sixth transistor M6 is connected to the light emitting line Ei. The sixth transistor M6 can be turned on or off in response to a light emitting signal transmitted to the light emitting line Ei.

According to an embodiment, the seventh transistor M7 is connected between the second gate electrode 120 and the light emitting line Ei. A gate electrode of the seventh transistor M7 and the second gate electrode 120 are electrically connected to each other, and the seventh transistor M7 can function as a diode. For example, the seventh transistor M7 is turned on when the light emitting signal is transmitted to the light emitting line Ei and is turned off in other cases.

According to an embodiment, the storage capacitor Cst is connected between the first power supply voltage line ELVDDL and the first node N1.

In an organic light emitting diode OLED according to an embodiment, an anode electrode thereof is connected to one electrode of the sixth transistor M6, and a cathode electrode thereof is connected to a second power supply voltage line ELVSSL.

According to an embodiment, the first power supply voltage ELVDD, which is a high-level voltage, is transmitted to the first power supply voltage line ELVDDL, the second power supply voltage ELVSS, which is a low-level voltage, is transmitted to the second power supply voltage line ELVSSL, a data signal is transmitted to the data line Dj, a light emitting signal is transmitted to the light emitting line Ei, a first scan signal is transmitted to the first scan line Si, and a second scan signal is transmitted to the second scan line S(i−1). The first scan signal transmitted to the first scan line Si and the second scan signal transmitted to the second scan line S(i−1) differ from each other. For example, the first scan line Si is an i-th scan line and the second scan line S(i−1) is an i−1-th scan line.

Figure 3:
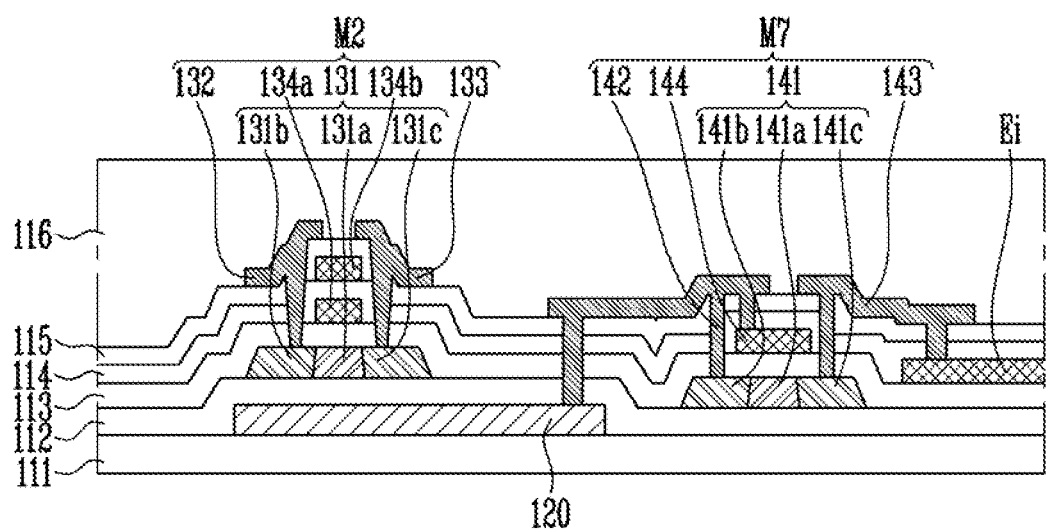
FIG. 3 is a schematic cross-sectional diagram of one pixel of a display device according to an exemplary embodiment of the present disclosure.

FIG. 3 is a schematic cross-sectional diagram of one pixel of a display device according to an exemplary embodiment of the present disclosure. FIG. 3 is a schematic cross-sectional diagram of the pixel PXij in FIGS. 1 and 2 and does not illustrate other elements except for the second gate electrode 120, the second transistor M2, the seventh transistor M7 and the light emitting line Ei.

Referring to FIG. 3, according to an embodiment, a substrate 111 supports various configurations of elements of the display device 100. The substrate 111 may be formed of, for example, a plastic, such as polyimide, but embodiments are not limited thereto.

According to an embodiment, the second gate electrode 120 is disposed on the substrate 111. The second gate electrode 120 overlaps an active layer 131 of the second transistor M2, and a width of the second gate electrode 120 is greater than a width of the active layer 131 of the second transistor M2 in a cross-sectional view. The second gate electrode 120 may be formed of various metals. An insulating layer may be disposed between the substrate 111 and the second gate electrode 120. The insulating layer increases adhesion between the substrate 111 and layers formed on the insulating layer and can block alkali components, etc., that flow out of a lower portion from flowing to an upper portion of the insulating layer. The insulating layer may be a single layer of silicon nitride (SiNx) or silicon oxide (SiOx), or a multilayer structure of silicon nitride (SiNx) and silicon oxide (SiOx), and embodiments are not limited thereto. However, the insulating layer that can be disposed between the substrate 111 and the second gate electrode 120 may be omitted.

According to an embodiment, the second gate electrode 120 protects the active layer 131 of the second transistor M2. Specifically, when the substrate 111 is formed of a plastic material, and when the insulating layer that can be disposed between the second gate electrode 120 and the substrate 111 includes silicon nitride (SiNx), hydrogen or moisture can diffuse upward from the substrate 111 or the insulating layer and damage the active layer 131 of the second transistor M2. In addition, a threshold voltage Vth of the second transistor M2 can change due to a current drop phenomenon generated by the substrate 111, which can reliability of the display device 100. According to an embodiment, the second gate electrode 120 is disposed under the active layer 131 of the second transistor M2 and overlaps the active layer 131 to block hydrogen or moisture from diffusing out of the bottom, which can prevent a threshold voltage shift of the second transistor M2 from occurring.

According to an embodiment, a buffer layer 112 is disposed on the second gate electrode 120 and the substrate 111. The buffer layer 112 insulates the second gate electrode 120 from the active layer 131 of the second transistor M2. The buffer layer 112 may be a single layer of silicon nitride (SiNx) or silicon oxide (SiOx), or a multilayer structure of silicon nitride (SiNx) and silicon oxide (SiOx), but embodiments are not limited thereto. The buffer layer 112 has a contact hole formed to allow the light emitting line Ei to come into contact with the second gate electrode 120.

According to an embodiment, the second transistor M2 is disposed on the buffer layer 112. The second transistor M2 is a top gate type coplanar structure. However, embodiments of the present disclosure are not limited thereto.

Specifically, according to an embodiment, the active layer 131 of the second transistor M2 is disposed on the buffer layer 112. The active layer 131 is formed of low temperature poly-silicon (LTPS) or an oxide semiconductor, but embodiments are not limited thereto. The active layer 131 includes a channel region 131a in which a channel is formed, a source region 131b connected to a source electrode 132, and a drain region 131c connected to a drain electrode 133. The channel region 131a of the second transistor M2 is doped with, for example, boron. When the channel region 131a of the second transistor M2 is doped with boron, the threshold voltage of the second transistor M2 is positively shifted, which can improve an afterimage of the display device 100.

According to an embodiment, a first gate insulating layer 113 is formed on the active layer 131. The first gate insulating layer 113 may be a single layer of silicon nitride (SiNx) or silicon oxide (SiOx), or a multilayer structure of silicon nitride (SiNx) and silicon oxide (SiOx). Contact holes are formed in the first gate insulating layer 113 through which the source electrode 132 and the drain electrode 133 of the second transistor M2 make contact with the source region 131b and the drain region 131c of the active layer 131, respectively, and through which the light emitting line Ei makes contact with the second gate electrode 120.

According to an embodiment, a 1-1-th gate electrode 134a of the second transistor M2 is formed on the first gate insulating layer 113. The 1-1-th gate electrode 134a is formed of a metal such as molybdenum (Mo). The 1-1-th gate electrode 134a overlaps the channel region 131a of the active layer 131 of the second transistor M2.

According to an embodiment, a second gate insulating layer 114 is formed on the 1-1-th gate electrode 134a and the first gate insulating layer 113. The second gate insulating layer 114 is formed of the same material as the first gate insulating layer 113 and may be a single layer of silicon nitride (SiNx) or silicon oxide (SiOx), or a multilayer structure of silicon nitride (SiNx) and silicon oxide (SiOx). Contact holes are formed in the second gate insulating layer 114 through which the source electrode 132 and the drain electrode 133 make contact with the source region 131b and the drain region 131c of the active layer 131, respectively.

According to an embodiment, a 1-2-th gate electrode 134b of the second transistor M2 is formed on the second gate insulating layer 114. The 1-2-th gate electrode 134b is formed of the same material as the 1-1-th gate electrode 134a and is formed of a metal such as molybdenum (Mo). The 1-2-th gate electrode 134b overlaps the channel region 131a of the active layer 131 of the second transistor M2. As such, the first gate electrodes 134a and 134b of the second transistor M2 form a double layer. However, embodiments of the present disclosure are not limited thereto, and the first gate electrodes 134a and 134b of the second transistor M2 may be a single layer.

According to an embodiment, an interlayer insulating layer 115 is formed on the 1-2-th gate electrode 134b and the second gate insulating layer 114. The interlayer insulating layer 115 is formed of an inorganic material such as silicon nitride (SiNx) or silicon oxide (SiOx), and may be a single layer or a plurality of layers, but embodiments are not limited thereto.

According to an embodiment, the source electrode 132 and the drain electrode 133 of the second transistor M2 are formed on the interlayer insulating layer 115. The source electrode 132 and the drain electrode 133 are electrically connected to the active layer 131 through the contact holes formed in the first gate insulating layer 113, the second gate insulating layer 114 and the interlayer insulating layer 115. The source electrode 132 and the drain electrode 133 are formed of a conductive material, and the source electrode 132 and the drain electrode 133 may be formed of the same material through the same process, although embodiments of the present disclosure are not limited thereto.

According to an embodiment, the light emitting line Ei is formed on the first gate insulating layer 113. The light emitting line Ei is formed of the same material as the 1-1-th gate electrode 134a of the second transistor M2 and a gate electrode 144 of the seventh transistor M7 and is formed of a metal such as molybdenum (Mo).

According to an embodiment, the seventh transistor M7 is disposed on the buffer layer 112. Specifically, the seventh transistor M7 has a top gate type coplanar structure. However, embodiments of the present disclosure are not limited thereto.

Specifically, according to an embodiment, an active layer 141 of the seventh transistor M7 is disposed on the buffer layer 112. The active layer 141 is formed of low temperature poly-silicon (LTPS) or an oxide semiconductor, but embodiments are not limited thereto. The active layer 141 includes a channel region 141a in which a channel is formed, a source region 141b connected to a source electrode 142 of the seventh transistor M7, and a drain region 141c connected to a drain electrode 143 of the seventh transistor M7. The active layer 141 of the seventh transistor M7 is formed of the same material as the active layer 131 of the second transistor M2, but embodiments are not limited thereto.

According to an embodiment, the first gate insulating layer 113 is formed on the active layer 141, and the gate electrode 144 of the seventh transistor M7 is formed on the first gate insulating layer 113. The gate electrode 144 of the seventh transistor M7 is formed of the same material as the first gate electrodes 134a and 134b of the second transistor M2 and is formed of a metal such as molybdenum (Mo). The gate electrode 144 overlaps the channel region 141a of the active layer 141 of the seventh transistor M7.

According to an embodiment, the second gate insulating layer 114 and the interlayer insulating layer 115 are sequentially formed on the gate electrode 144 and the first gate insulating layer 113. Contact holes are formed in the second gate insulating layer 114 and the interlayer insulating layer 115 through which the source electrode 142 and the drain electrode 143 make contact with the source region 141b and the drain region 141c of the active layer 141, respectively.

According to an embodiment, the source electrode 142 and the drain electrode 143 of the seventh transistor M7 are formed on the interlayer insulating layer 115. The source electrode 142 and the drain electrode 143 are electrically connected to the active layer 141 through the contact holes formed in the first gate insulating layer 113, the second gate insulating layer 114, and the interlayer insulating layer 115. The source electrode 142 and the drain electrode 143 of the seventh transistor M7 can be formed of the same material through the same process as the source electrode 132 and the drain electrode 133 of the second transistor M2, although embodiments of the present disclosure are not limited thereto.

According to an embodiment, the source electrode 142 of the seventh transistor M7 is connected to the gate electrode 144 through the contact holes formed in the second gate insulating layer 114 and the interlayer insulating layer 115. Accordingly, the seventh transistor M7 can function as a diode.

According to an embodiment, the seventh transistor M7 is connected between the second gate electrode 120 and the light emitting line Ei. Specifically, the source electrode 142 of the seventh transistor M7 is electrically connected to the second gate electrode 120 through the contact hole formed in the buffer layer 112, the first gate insulating layer 113, the second gate insulating layer 114, and the interlayer insulating layer 115. The drain electrode 143 of the seventh transistor M7 is electrically connected to the light emitting line Ei through the contact hole formed in the second gate insulating layer 114 and the interlayer insulating layer 115. Accordingly, the second gate electrode 120 is connected to the light emitting line Ei through the seventh transistor M7.

According to an embodiment, a planarization layer 116 is disposed on the second transistor M2, the seventh transistor M7, and the interlayer insulating layer 115. The planarization layer 116 planarizes upper portions of the second transistor M2 and the seventh transistor M7. The planarization layer 116 may be a single layer as illustrated in FIG. 3 or may be a multi-layered structure. The planarization layer 116 may be formed of an acryl-based organic material, however, embodiments are not limited thereto.

In some exemplary embodiments, a passivation layer is formed between the second and seventh transistors M2 and M7 and the planarization layer 116. That is, to protect the second transistor M2 and the seventh transistor M7 from penetration of moisture or oxygen, etc., a passivation layer is formed that covers the upper portion. The passivation layer is formed of an inorganic material and may be a single layer or a multilayer structure, but embodiments are not limited thereto. The passivation layer may be omitted.

Next, each signal that operates during one image frame of the display device 100 described with reference to FIGS. 1 to 3 will be described with reference to FIG. 4.

Figure 4:
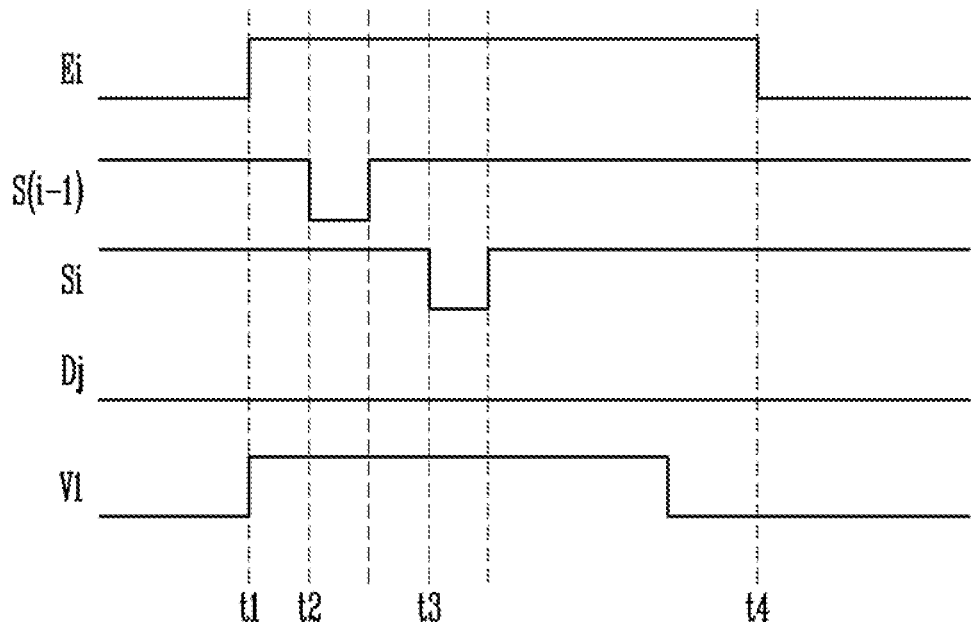
FIG. 4 is a timing diagram for one frame of a display device according to an exemplary embodiment of the present disclosure.

FIG. 4 is a timing diagram for one frame of a display device according to an exemplary embodiment of the present disclosure. The timing diagram of FIG. 4 illustrates the light emitting signal transmitted to the i-th light emitting line Ei of one pixel PXij of the display device 100 of FIGS. 1 to 3, the first scan signal transmitted to the first scan line Si, the second scan signal transmitted to the second scan line S(i−1), the data signal transmitted to the j-th data line Dj, and a first voltage V1 transmitted to the second gate electrode 120.

First, according to an embodiment, during a period prior to a first time point t1, the light emitting signal is at a turn-on level. The fifth transistor M5 and the sixth transistor M6 are maintained in a turned-on state in response to the light emitting signal, and the seventh transistor M7 operating as a diode cuts off an electrical connection between the second gate electrode 120 and the light emitting line Ei. The second gate electrode 120 maintains a floating state during the period prior to the first time point t1. The period prior to the first time point t1 is a light emission permission period in which the organic light emitting diode OLED can emit light.

According to an embodiment, the light emitting signal changes from a turn-on level to a turn-off level at the first time point t1. The fifth transistor M5 and the sixth transistor M6 are turned off in response to the light emitting signal, and the organic light emitting diode OLED stops emitting light. When the light emitting signal changes to the turn-off level, the seventh transistor M7 connected as a diode is turned on. If the seventh transistor M7 is turned on, the light emitting line Ei is electrically connected to the second gate electrode 120, and a turn-off level light emitting signal is transmitted to the second gate electrode 120. The turn-off level light emitting signal is a high-level voltage, and the first voltage V1 transmitted to the second gate electrode 120 is the same voltage as the high-level light emitting signal voltage.

According to an embodiment, when a turn-off level light emitting signal is transmitted to the second gate electrode 120 in this way, a threshold voltage of the second transistor M2 is negatively shifted, which can suppress an increase in a leakage current of the second transistor M2. In detail, when no second gate electrode 120 is disposed, scan signals are periodically transmitted to the first gate electrodes 134a and 134b of the second transistor M2, which can positively shift the threshold voltage of the second transistor M2. If the threshold voltage of the second transistor M2 is positively shifted in this way, a leakage current of the second transistor M2 increases, which can deteriorate image quality. Meanwhile, if a high-level voltage turn-off light emitting signal is periodically transmitted to the second gate electrode 120, which is a back gate of the second transistor M2, as in an exemplary embodiment of the present disclosure, the threshold voltage of the second transistor M2 is negatively shifted, which suppresses an increase in the leakage current.

According to an embodiment, at a second time point t2, the second scan signal changes from a turn-off level to a turn-on level. The fourth transistor M4 is turned on in response to the second scan signal. Accordingly, an initialization voltage transmitted through an initialization power supply line VINTL is transmitted to the first node, and the gate electrode of the first transistor M1 is initialized by an initialization voltage.

According to an embodiment, at a third time point t3, the first scan signal changes from a turn-off level to a turn-on level, the light emitting signal is at a turn-off level, and a data signal is transmitted to the data line Dj. The second transistor M2 and the third transistor M3 are turned on in response to the first scan signal, and the fifth transistor M5 and the sixth transistor M6 are maintained in a turn-off state. Accordingly, the data signal is transmitted to one electrode of the storage capacitor Cst through the data line Dj, the second transistor M2, the first transistor M1, and the third transistor M3, and the storage capacitor Cst, records a difference between a data voltage of the data signal and the first power supply voltage.

According to an embodiment, at a fourth time point t4, the light emitting signal changes from a turn-off level to a turn-on level. The fifth transistor M5 and the sixth transistor M6 are turned on in response to the light emitting signal, and the seventh transistor M7 cuts off an electrical connection between the second gate electrode 120 and the light emitting line Ei. Accordingly, a current path is created that connects the first power supply voltage line ELVDDL, the fifth transistor M5, the first transistor M1, the sixth transistor M6, the organic light emitting diode OLED, and the second power supply voltage line ELVSSL. The amount of current flowing through the current path is determined according to a magnitude of the voltage stored in the storage capacitor Cst connected to the gate electrode of the first transistor M1. A period after the fourth time point t4 is a period in which the organic light emitting diode OLED can emit light, and the second gate electrode 120, whose electrical connection with the light emitting line Ei is cut off, is maintained in a floating state.

In the display device 100 according to an exemplary embodiment of the present disclosure, the second gate electrode 120 that overlaps the active layer 131 of the second transistor M2 is disposed between the substrate 111 and the second transistor M2, and the second gate electrode 120 is connected to the light emitting line Ei through the seventh transistor M7 functioning as a diode. Accordingly, a light emitting signal is transmitted to the second gate electrode 120 during a light emission non-permission period in which a high-level voltage turn-off light emitting signal is transmitted to the light emitting line Ei. In this way, when a high-level voltage is transmitted to the second gate electrode 120, a threshold voltage of the second transistor M2 can be negatively shifted.

According to an embodiment, if the active layer 131 of the second transistor M2 is doped with boron as described above, the threshold voltage of the second transistor M2 can be positively shifted to reduce an afterimage of the display device 100. However, when the display device 100 is used for long periods of time or in a high-temperature environment by a user, the threshold voltage of the second transistor M2 can be further positively shifted, and a horizontal stripe may be visible in the display device 100. Even when a horizontal line is intended to be displayed on one region of a screen of the display device 100, another horizontal line will be displayed on another region of the display device 100, and thus, the horizontal stripe can be visually recognized on the screen of the display device as a whole.

However, according to an embodiment, in the display device 100 according to an exemplary embodiment of the present disclosure, during at least a part of the image frame, that is, a light emission non-permission period, a high-level voltage light emitting signal is transmitted to the second gate electrode 120, and a threshold voltage of the transistor M2 is negatively shifted. Accordingly, an afterimage of the display device 100 is reduced, and even when the display device 100 is used at a high temperature or for long periods of time, the threshold voltage of the second transistor M2 is negatively shifted, which can reduce generation of horizontal stripes.

Figure 5:
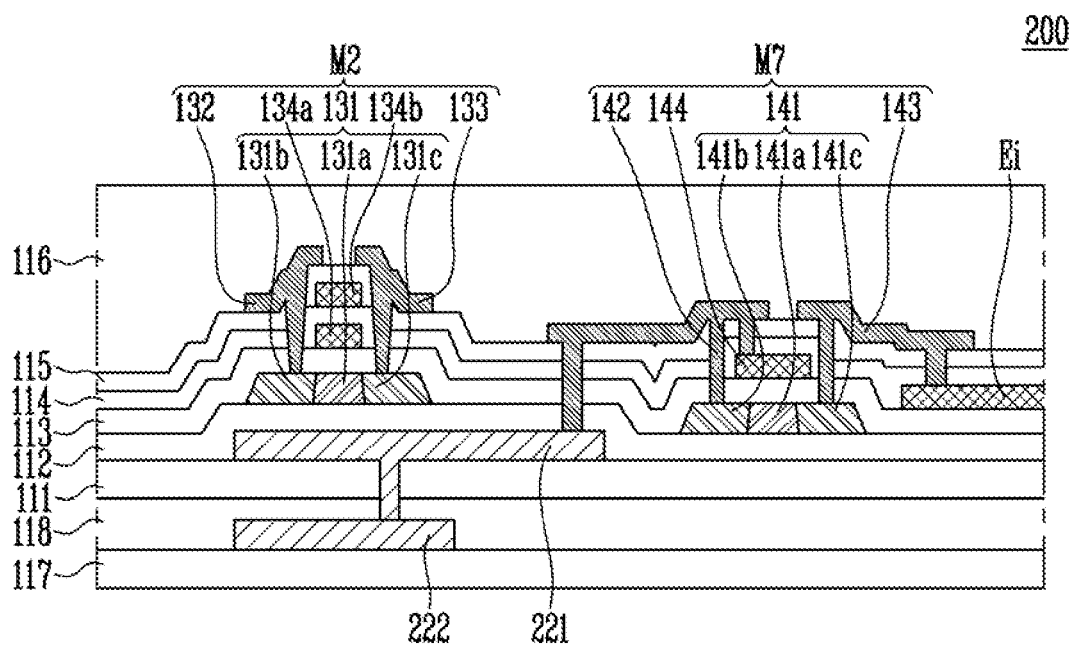
FIG. 5 is a schematic cross-sectional diagram of one pixel of a display device according to another exemplary embodiment of the present disclosure.

FIG. 5 is a schematic cross-sectional diagram of one pixel of a display device according to another exemplary embodiment of the present disclosure. A display device 200 of FIG. 5 is substantially the same as the display device 100 of FIGS. 1 to 4 except that second gate electrodes 221 and 222 are different from the second gate electrode 120, and duplicate description thereof will be omitted.

Referring to FIG. 5, according to an embodiment, the first substrate 111 can support various configuration elements of the display device 200. The first substrate 111 is substantially the same as the substrate 111 of FIGS. 1 to 4. A 2-1-th gate electrode 221 is disposed on the first substrate 111. The 2-1-th gate electrode 221 overlaps the active layer 131 of the second transistor M2 between the first substrate 111 and the second transistor M2. The 2-1-th gate electrode 221 can be formed of various metal materials. An insulating layer may be disposed between the 2-1-th gate electrode 221 and the first substrate 111 to isolate the 2-1-th gate electrode 221 from the first substrate 111. However, the insulating layer may be omitted. A contact hole is formed in the first substrate 111 through which the 2-1-th gate electrode 221 makes contact with a 2-2-th gate electrode 222.

According to an embodiment, the first buffer layer 112 is disposed on the 2-1-th gate electrode 221 and the first substrate 111. The first buffer layer 112 insulates the 2-1-th gate electrode 221 from the active layer 131 of the second transistor M2. The first buffer layer 112 may be a single layer of silicon nitride (SiNx) or silicon oxide (SiOx), or a multilayer structure of silicon nitride (SiNx) and silicon oxide (SiOx), but embodiments are not limited thereto.

According to an embodiment, a second substrate 117 is disposed under the first substrate 111. The second substrate 117 can support various configuration elements of the display device 200 thereon and is formed of the same material as the first substrate 111. For example, the second substrate 117 can be formed of a plastic such as polyimide, however, embodiments of the present disclosure are not limited thereto.

According to an embodiment, the 2-2-th gate electrode 222 is disposed on the second substrate 117. The 2-2-th gate electrode 222 overlaps the active layer 131 of the second transistor M2, a width of the 2-2-th gate electrode 222 is greater than a width of the active layer 131 in a cross-sectional view, and a width of the 2-1-th gate electrode 221 is greater than a width of the 2-2-th gate electrode 222 in a cross-sectional view. The 2-2-th gate electrode 222 can be formed of various metal materials, and is formed of, for example, the same material as the 2-1-th gate electrode 221.

According to an embodiment, a second buffer layer 118 is disposed on the 2-2-th gate electrode 222 and the second substrate 117. The second buffer layer 118 is an insulating layer that planarizes an upper surface of the 2-2-th gate electrode 222 and helps bond the second substrate 117 and the 2-2-th gate electrode 222 to the first substrate 111. The second buffer layer 118 is formed of the same material as the first buffer layer 112 and may be a single layer of silicon nitride (SiNx) or silicon oxide (SiOx), or a multilayer structure of silicon nitride (SiNx) and silicon oxide (SiOx), but embodiments are not limited thereto. A contact hole is formed in the first substrate 111 and the second buffer layer 118 through which the 2-1-th gate electrode 221 makes contact with the 2-2-th gate electrode 222.

According to an embodiment, the second substrate 117, the 2-2-th gate electrode 222, and the second buffer layer 118 are disposed under the first substrate 111 and are in contact with the first substrate 111. An upper surface of the second buffer layer 118 makes contact with a lower surface of the second substrate 117.

According to an embodiment, the 2-1-th gate electrode 221 is electrically connected to the 2-2-th gate electrode 222 through the contact hole formed in the first substrate 111 and the second buffer layer 118. As described above, the 2-1-th gate electrode 221 is connected to the light-emitting line Ei through the seventh transistor M7, and thus a high-level voltage light emitting signal can be transmitted to the 2-1-th gate electrode 221 during the light emission non-permissible period in which a turn-off level light emitting signal is transmitted to the light-emitting line Ei. A high-level voltage light emitting signal is also transmitted to the 2-2-th gate electrode 222 electrically connected to the 2-1-th gate electrode 221 during the light emission non-permission period. In this way, a high-level voltage is transmitted to the 2-1-th gate electrode 221 and the 2-2-th gate electrode 222 during the light emission non-permission period of each image frame. The two layers of the second gate electrodes 221 and 222 to which a high-level voltage is transmitted are formed under the active layer 131 of the second transistor M2. The second gate electrodes 221 and 222 have a two-layer structure. Therefore, a negative shift of a threshold voltage of the second transistor M2 can be more effectively performed, and even when the display device 200 is used for a long period of time or at a high temperature, generation of horizontal stripes can be further reduced.

Figure 6:
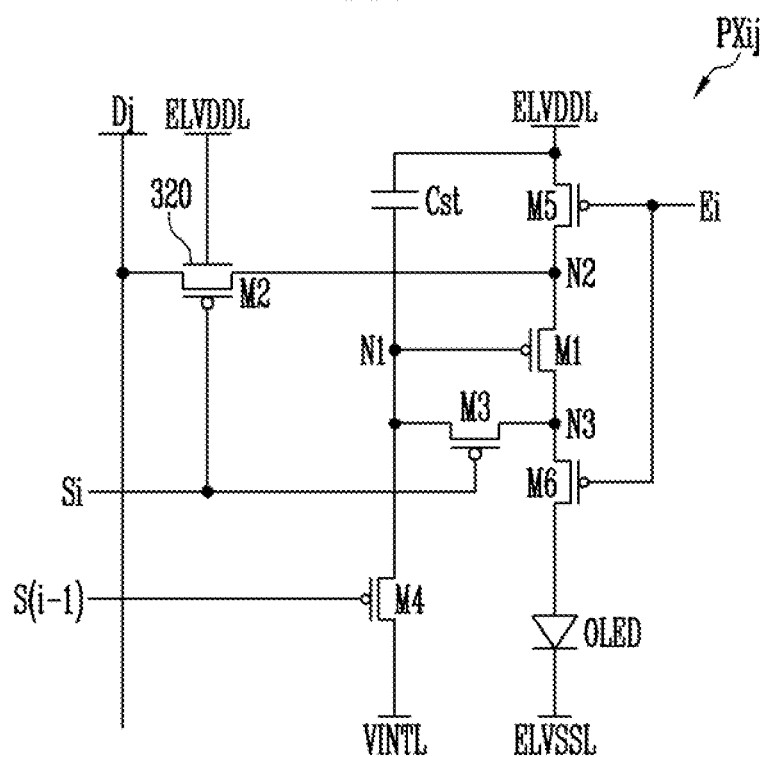
FIG. 6 is a circuit diagram of one pixel of a display device according to another exemplary embodiment of the present disclosure.
Figure 7:
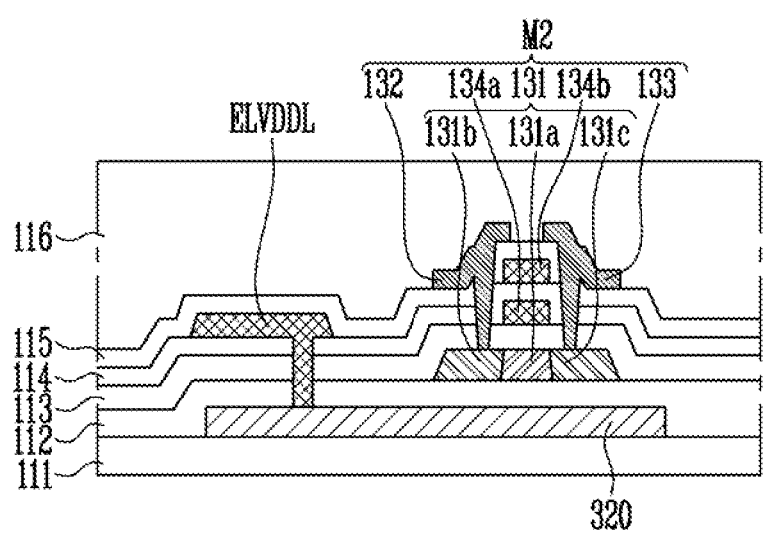
FIG. 7 is a schematic cross-sectional diagram of one pixel of a display device according to another exemplary embodiment of the present disclosure.

FIG. 6 is a circuit diagram of one pixel of a display device 300 according to another exemplary embodiment of the present disclosure. FIG. 7 is a schematic cross-sectional diagram of one pixel of the display device 300 according to another exemplary embodiment of the present disclosure. The display device 300 of FIGS. 6 and 7 is substantially the same as the display device 100 of FIGS. 1 to 4 except that the second gate electrode 320 is connected to the first power supply voltage line ELVDDL and no seventh transistor M7 is provided, and duplicate description thereof will be omitted.

Referring to FIGS. 6 and 7, according to an embodiment, the second gate electrode 320 is disposed under the second transistor M2 and overlaps the active layer 131 of the second transistor M2, and is electrically connected to the first power supply voltage line ELVDDL. Specifically, the first power supply voltage line ELVDDL is formed on the second gate insulating layer 114, and the first power supply voltage line ELVDDL is formed of the same material as the 1-1-th gate electrode 134a of the second transistor M2. The first power supply voltage line ELVDDL is electrically connected to the second gate electrode 320 through a contact hole formed in the buffer layer 112, the first gate insulating layer 113, and the second gate insulating layer 114.

According to an embodiment, the first power supply voltage is transmitted through the first power supply voltage line ELVDDL during each image frame. The first power supply voltage is a high-level power supply voltage. The second gate electrode 320 is electrically connected to the first power supply voltage line ELVDDL, and a high level first power supply voltage is continuously transmitted during each image frame.

In the display device 300 according to another exemplary embodiment of the present disclosure, the second gate electrode 320 that overlaps the active layer 131 of the second transistor M2 is electrically connected to the first power supply voltage line ELVDDL. Accordingly, a high level first power supply voltage can be continuously transmitted to the second gate electrode 320 during an image frame. In this way, when the high-level voltage is continuously transmitted to the second gate electrode 320, a threshold voltage of the second transistor M2 is negatively shifted. If the active layer 131 of the second transistor M2 is doped with boron as described above, the threshold voltage of the second transistor M2 can positively shift to reduce an afterimage of the display device 300. However, when a user uses the display device 300 for a long period of time or at a high-temperature, the threshold voltage of the second transistor M2 is further positively shifted, and a horizontal stripe may be visible in the display device 300. Accordingly, in the display device 300 according to another exemplary embodiment of the present disclosure, the high-level power supply voltage is continuously transmitted to the second gate electrode 320 during the entire period of the image frame, and the threshold voltage of the second transistor M2 is more effectively negatively shifted. Accordingly, an afterimage of the display device 300 is reduced, and generation of horizontal stripes can be more effectively reduced even when the display device 300 is used for a long period of time or at a high temperature.

According to an embodiment, the second gate electrode 320 of the display device 300 of FIGS. 6 and 7 can have a two-layer structure like the second gate electrodes 221 and 222 of the display device 200 of FIG. 5. Specifically, in the display device 300 of FIG. 7, the substrate 111 is the first substrate 111, and the second gate electrode 320 is the 2-1-th gate electrode 221. A second substrate 117, a second gate electrode 222, and a second buffer layer 118 can be further formed under the first substrate 111 as illustrated in FIG. 5. The 2-2-th gate electrode 222 overlaps the active layer 131 of the second transistor M2. The 2-2-th gate electrode 222 formed on the first substrate 111 is electrically connected to the 2-2-th gate electrode 222 through a contact hole formed in the substrate 111 and the second buffer layer 118. Accordingly, the first power supply voltage line ELVDDL, the 2-1-th gate electrode 221, and the 2-2-th gate electrode 222 are electrically connected to each other. Thus, the first power supply voltage can be continuously transmitted to the 2-1-th gate electrode 221 and the 2-2-th gate electrode 222 during an image frame, and the threshold voltage of the second transistor M2 can be more effectively negatively shifted by the two layered second gate electrodes 221 and 222.

Figure 8:
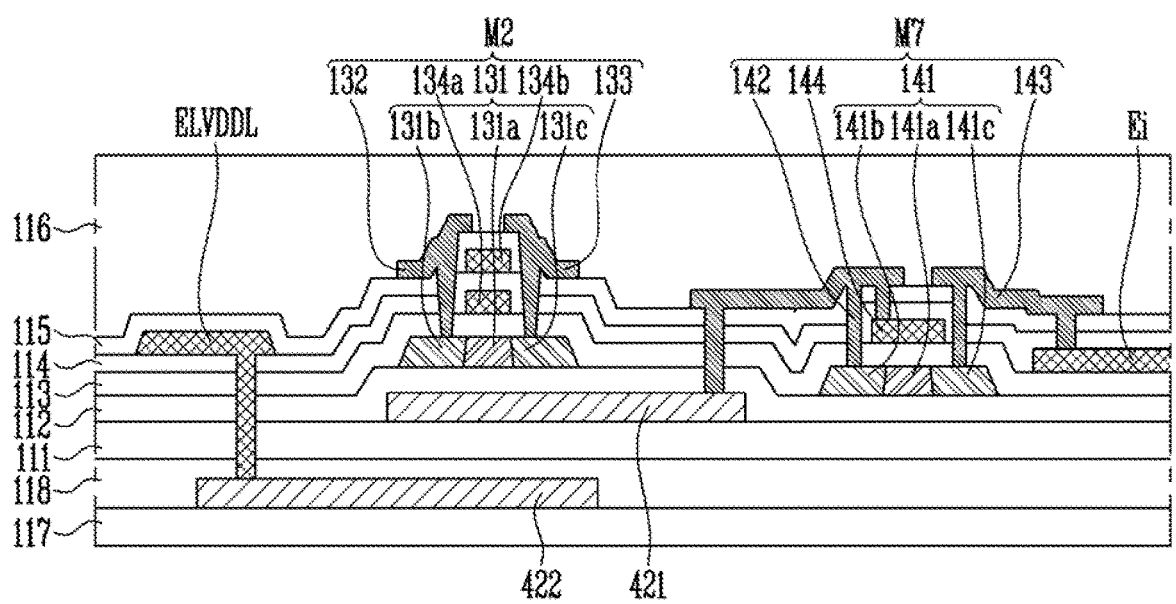
FIG. 8 is a schematic cross-sectional diagram of one pixel of a display device according to another exemplary embodiment of the present disclosure.

FIG. 8 is a schematic cross-sectional diagram of one pixel of a display device according to another exemplary embodiment of the present disclosure. A display device 400 of FIG. 8 is substantially the same as the display device 100 of FIGS. 1 to 4 except that the second gate electrodes 421 and 422 differ from the second gate electrode 120, and duplicate description thereof will be omitted.

According to an embodiment, the first substrate 111 supports various configuration elements of the display device 400. The first substrate 111 is substantially the same as the substrate 111 of FIGS. 1 to 4. A 2-1-th gate electrode 421 is disposed on the first substrate 111. The 2-1-th gate electrode 421 overlaps the active layer 131 of the second transistor M2 between the first substrate 111 and the second transistor M2. The 2-1-th gate electrode 421 can be formed of various metals.

According to an embodiment, the first buffer layer 112 is disposed on the 2-1-th gate electrode 421 and the first substrate 111. The first buffer layer 112 is an insulating layer that insulates the 2-1-th gate electrode 421 from the active layer 131 of the second transistor M2. A contact hole is formed in the first buffer layer 112 through which the source electrode 142 of the seventh transistor M7 is connected to the 2-1-th gate electrode 421. The drain electrode 143 of the seventh transistor M7 is connected to the light emitting line Ei. When a turn-off level light emitting signal is transmitted through the light emitting line Ei as described above, the high-level voltage turn-off level light emitting signal is transmitted to the 2-1-th gate electrode 421. Accordingly, a high-level voltage can be transmitted to the 2-1-th gate electrode 421 during the light emission non-permission period of each image frame. Since the 2-1-th gate electrode 421 is electrically disconnected from the light emitting line Ei during the light emission permission period by the seventh transistor M7, the 2-1-th gate electrode 421 can float.

According to an embodiment, the second substrate 117 is disposed under the first substrate 111. The second substrate 117 can support various configuration elements of the display device 400 on the second substrate 117 and is formed of the same material as the first substrate 111. For example, the second substrate 117 is formed of a plastic such as polyimide, although embodiments are not limited thereto.

According to an embodiment, the 2-2-th gate electrode 422 is disposed on the second substrate 117. The 2-2-th gate electrode 422 overlaps the active layer 131 of the second transistor M2, and a width of the 2-2-th gate electrode 422 is greater than a width of the active layer 131 of the second transistor M2 in a cross-sectional view. The 2-2-th gate electrode 422 can be formed of various metal materials and is formed of the same material as, for example, the 2-1-th gate electrode 421.

According to an embodiment, the second buffer layer 118 is disposed on the 2-2-th gate electrode 422 and the second substrate 117. The second buffer layer 118 is an insulating layer that planarizes an upper surface of the 2-2-th gate electrode 422 and helps bond the second substrate 117 and the 2-2-th gate electrode 422 to the first substrate 111. The second buffer layer 118 is formed of the same material as the first buffer layer 112, may be a single layer of silicon nitride (SiNx) or silicon oxide (SiOx), or be a multilayer structure of silicon nitride (SiNx) and silicon oxide (SiOx), but embodiments are not limited thereto.

According to an embodiment, the second substrate 117, the 2-2-th gate electrode 422, and the second buffer layer 118 are in contact with the first substrate 111 under the first substrate 111. An upper surface of the second buffer layer 118 makes contact with a lower surface of the second substrate 117.

According to an embodiment, the 2-2-th gate electrode 422 is connected to the first power supply voltage line ELVDDL through a contact hole formed in the second buffer layer 118, the first substrate 111, the first buffer layer 112, the first gate insulating layer 113, and the second gate insulating layer 114. A high level first power supply voltage is transmitted to the first power supply voltage line ELVDDL during each image frame. The 2-2-th gate electrode 422 is electrically connected to the first power supply voltage line ELVDDL, and high level first power supply voltage can be continuously transmitted during each image frame.

In addition, according to an embodiment, in the display device 400 of FIG. 8, the 2-1-th gate electrode 421 and the 2-2-th gate electrode 422 may be connected differently than what is shown in FIG. 8 Specifically, the 2-1-th gate electrode 421 may be connected to the first power supply voltage line ELVDDL and the 2-2-th gate electrode 422 may be connected to the seventh transistor M7, but embodiments of the gate electrodes are not limited thereto.

In the display device 400 according to another exemplary embodiment of the present disclosure, the 2-1-th gate electrode 421 is connected to the light emitting line Ei through the seventh transistor M7 and receives a high-level voltage during a light emission non-permission, and the 2-2-th gate electrode 422 is connected to the first power supply voltage line ELVDDL and continuously receives a high-level power supply voltage during an image frame. Accordingly, a threshold voltage of the second transistor M2 can be negatively shifted as a high-level voltage is transmitted to the 2-1-th gate electrode 421 and the 2-2-th gate electrode 422 during a light emission non-permission period. In addition, the threshold voltage of the second transistor M2 is negatively shifted as the high-level voltage is transmitted to the 2-2-th gate electrode 422 during the light emission permission period. Therefore, the negative shift of the threshold voltage of the second transistor M2 can be more effectively performed, and even when the display device 400 is used for a long period of time or at a high temperature, generation of horizontal stripes can be further reduced.

According to an embodiment, either or both of the 2-1-th gate electrode 421 or the 2-2-th gate electrode 422 of the display device 400 of FIG. 8 can have a two-layer structure like the second gate electrodes 221 and 222 of the display device 200 of FIG. 5. Specifically, in the display device 400 of FIG. 8, a third substrate and a third buffer layer can be further formed under the first substrate 111, and a fourth substrate and a fourth buffer layer can be further formed under the second substrate 117 similar to that illustrated in FIG. 5. The second layer of the 2-1-th gate electrode 421 or the 2-2-th gate electrode 422 can then be formed between the third substrate and the third buffer layer, and between the fourth substrate and a fourth buffer layer, respectively. Contact holes can be formed through the first substrate 111 and the third buffer layer so that the 2-1-th gate electrode 421 can be electrically connected to its second layer, and contact holes can be formed through the second substrate 117 and the fourth buffer layer so that the 2-2-th gate electrode 422 can be electrically connected to its second layer.

The foregoing detailed description exemplifies and explains exemplary embodiments of the present disclosure. However, embodiments of the present disclosure may be used in various other combinations, changes, and environments from those described above and may be changed or modified within the scope of embodiments of the inventive concepts disclosed in the present specification, the scope equivalent to the described disclosure, and/or the skill or knowledge of the art. Accordingly, the foregoing detailed description of exemplary embodiments of the disclosure is not intended to limit the disclosure to the disclosed exemplary embodiments. In addition, the appended claims should be construed to include other exemplary embodiments.

What is claimed is:

1. A display device, comprising:
   a plurality of pixels,
   wherein each pixel includes:
      a first transistor that controls an amount of current which is supplied from a first power supply voltage line connected via a second node to an organic light emitting diode in response to a voltage of a first node;
      a second transistor connected between a data line and the second node and that includes a first gate electrode connected to a first scan line and one of at least one second gate electrode connected to the first power supply voltage line; and
      a light emitting line connected to a gate electrode of at least one light emitting transistor located in a current path between the first power supply voltage line and the organic light emitting diode,
   wherein a light emitting signal is transmitted to over the light emitting line the one of at least one second gate electrode of the second transistor when the light emitting signal of the light emitting line is at a high level, and the one of at least one second gate electrode floats when the light emitting signal is at a low level.

2. The display device of claim 1, wherein the high level light emitting signal is transmitted to the one of at least one second gate electrode during a light emission non-permission period of the organic light emitting diode.

3. The display device of claim 1,
   wherein each of the pixels further includes:
      a third transistor connected between the first node and a third node and that includes a gate electrode connected to a first scan line;
      a fourth transistor connected between the first node and an initialization power supply and that includes a gate electrode connected to a second scan line; and
      a storage capacitor connected between the first power supply voltage line and the first node, and
   wherein the at least one light emitting transistor includes:
      a fifth transistor connected between the first power supply voltage line and the second node and that includes a gate electrode connected to the first node; and
      a sixth transistor connected between the third node and the organic light emitting diode and that includes a gate electrode connected to the light emitting line.

4. The display device of claim 1, wherein an active layer of the second transistor has a doped channel region, and the one of at least one second gate electrode overlaps an active layer of the second transistor.

5. The display device of claim 1, further comprising:
   a seventh transistor connected between another at least one second gate electrode of the second transistor and the light emitting line,
   wherein a gate electrode and a first electrode of the seventh transistor are connected to the another at least one second gate electrode, and
   wherein a second electrode of the seventh transistor is connected to the light emitting line.

6. The display device of claim 5, wherein a high-level voltage is continuously transmitted to the another at least one second gate electrode during an image frame.

7. The display device of claim 5, wherein the another at least one second gate electrode includes two layers electrically connected to each other with an insulating layer interposed therebetween.

8. The display device of claim 1, wherein the one of at least one second gate electrode includes two layers electrically connected to each other with an insulating layer interposed therebetween.

* * * * *